AUTOMATIC PROGRAMMED DELIVERY SYSTEM

Filed June 7, 1956 3 Sheets-Sheet 1

INVENTORS.
Martin Kaplan &
Daniel E. Townsend, Jr.
BY Morris A. Rabkin
ATTORNEY.

INVENTORS.
Martin Kaplan &
Daniel E. Townsend, Jr.
BY
Morris L. Rabkin
ATTORNEY.

AUTOMATIC PROGRAMMED DELIVERY SYSTEM

Filed June 7, 1956 3 Sheets-Sheet 3

INVENTORS.
Martin Kaplan &
Daniel E. Townsend, Jr.
BY Morris A. Rabkin
ATTORNEY.

2,891,654
Patented June 23, 1959

2,891,654

AUTOMATIC PROGRAMMED DELIVERY SYSTEM

Martin Kaplan, Scranton, Pa., and Daniel E. Townsend, Jr., Pennsauken, N.J., assignors to Radio Corporation of America, a corporation of Delaware Application June 7, 1956, Serial No. 589,996
11 Claims. (Cl. 198—19)

This invention relates to a system for programming and delivering articles to a plurality of fixed points, and more particularly to apparatus for selecting several articles from a plurality of storage bins and delivering them simultaneously, according to a predetermined plan, to several receiving stations.

The invention may be applied to a mechanized system for the production of printed circuits. A typical printed circuit consists of a wiring board having printed conductors on one or both sides thereof. The wiring board is provided with a number of holes. Components are mounted on the face of the board opposite to the printed conductors and the component leads extend through the holes for electrical connection to the printed conductors.

In typical production systems for printed circuits, a plurality of component insertion heads are arranged in sequence and printed wiring boards are carried adjacent these heads. Successive wiring boards are halted momentarily adjacent each head to permit the head to insert a component into the board. In the usual application, each head is provided with its own magazine of components and the magazine is, necessarily, relatively small in capacity. With this arrangement, a number of magazines spaced along the assembly line must be continuously supplied with a variety of components requiring a substantial number of attending personnel. In order to make a changeover from one printed circuit run to another, the assembly line must be shut down in order that magazines may be changed.

In accordance with the present invention, a stockroom comprising a bank of fixed magazines is provided. Each magazine contains a supply of a particular component and the magazine contains this particular component regardless of the type of printed circuit being run. The magazine for a given component is always in the same place and all of the magazines are localized in a central area. Since a given magazine is not associated with a particular head, the magazines are not located immediately adjacent to the heads, and hence the magazines may be larger. This arrangement facilitates the loading of the magazines and requires fewer attending personnel. Should it be necessary to provide an unusual or seldom used component for a particular printed circuit which is to be run, the magazine containing this particular type of component may be positioned in the stockroom without shutting down the assembly line.

An object of this invention is to provide a novel distributing system wherein articles are located in a central stockroom.

Another object of this invention is to provide a novel distributing system wherein articles are selected at random from a central stockroom and are delivered simultaneously in fixed order to fixed receiving stations.

A further object of this invention is to provide a novel system for a programmed selection of articles from a central stockroom for fixed order delivery to fixed receiving stations wherein the program means is readily and simply changed.

In accordance with the present invention, a plurality of receiving stations are arranged sequentially, either in a circular or in-line arrangement. An article stockroom comprises a plurality of magazines or bins arranged sequentially, either in a circular or in-line arrangement. Each of the magazines is provided with a mechanism for effecting the release of a single article from the magazine. A conveyor or transfer mechanism receives the articles as they are released from the magazines and delivers them to the receiving stations. The conveyor includes a group of transfer members or nests, or a plurality of groups of transfer members or nests, which receive the articles from the magazine. The number of nests in each group corresponds to the number of receiving stations and each nest in any one group is associated with a particular receiving station. The nests of each group are positioned on the conveyor in the same spacial relationship as the receiving stations. The conveyor, then, is constructed to deliver a group of articles to the receiving stations simultaneously.

The stockroom bins are not arranged in any particular order in relation to the receiving stations and a programming means controls the release of articles to the conveyor nests in a predetermined order. The programming means includes a cylindrical commutator member having radially separated conductive segments around its outer periphery. Each segment is electrically connected to the release mechanism of one of the magazines. An assembly comprising a plurality of wipers, corresponding in number to the number of nests in a nest group, is caused to rotate around the commutator member. Each wiper is functionally associated with one of the conveyor nests. An insulating mask or tape, having prepositioned apertures, is placed over the cylindrical member. This mask programs the engagement of the wipers with the commutator segments. The rotating wiper assembly is synchronized with the conveyor to provide for the discharge of the desired article into each conveyor nest.

The novel features of the invention, as well as additional objects and advantages thereof, will be understood more fully from the following description when read in connection with the accompanying drawings, in which.

Figure 1:
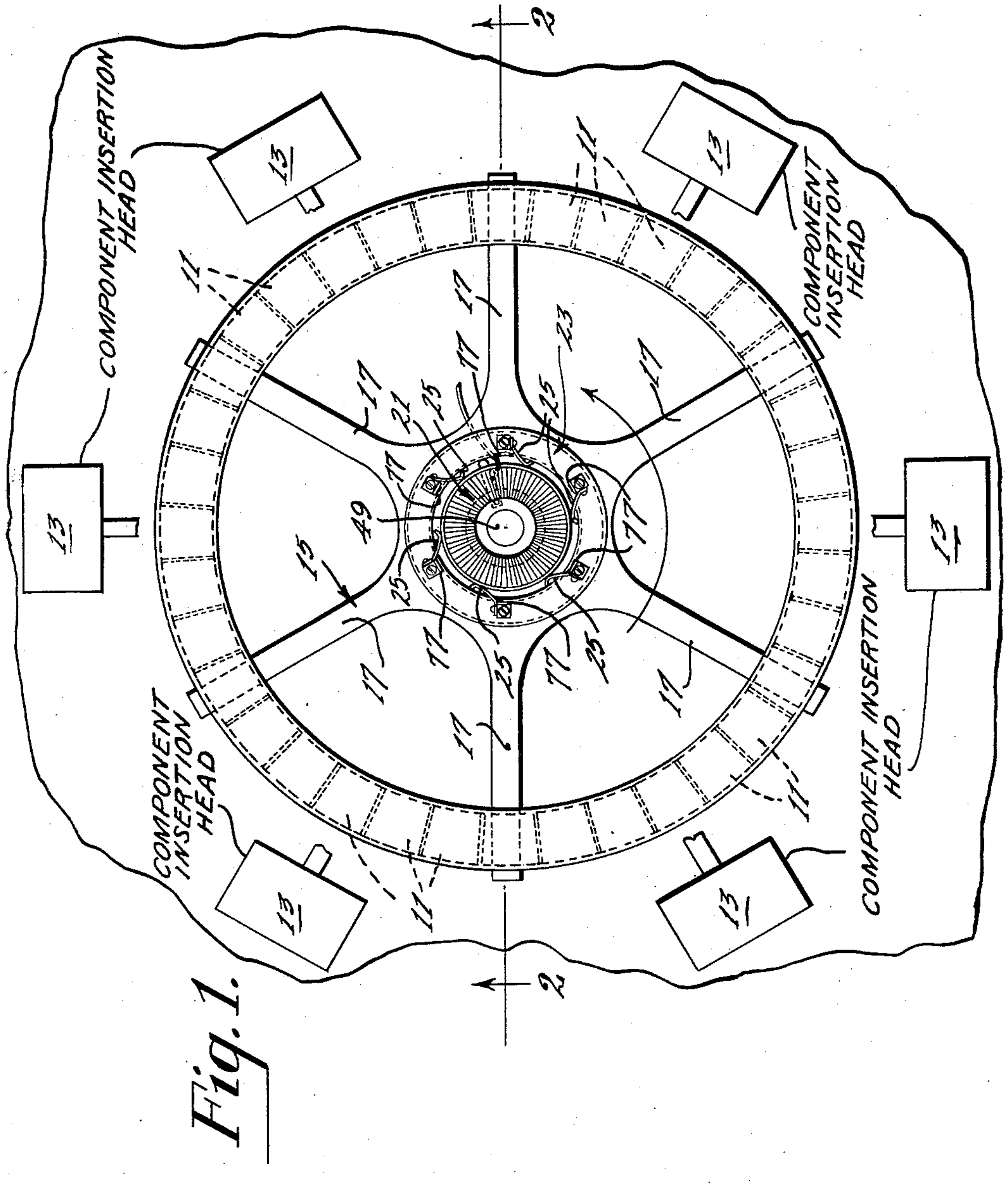
Figure 1 is a diagrammatic view, in plan, of one embodiment of the present invention.

Referring now in more detail to the accompanying drawings, the present invention will be described in two embodiments of a system for use in the manufacture of printed circuits. The articles distributed are components which are to be inserted in printed wiring boards to form the printed circuits. The receiving stations are component insertion heads which form the component leads and insert the components into the wiring boards.

Referring now in particular to Figures 1 to 4 of the accompanying drawings, apparatus in accordance with one embodiment of the invention will be described. In this embodiment, a plurality of magazines 11 are arranged in a circular array. A number of component insertion heads 13 are disposed in a circular array immediately outside of the array of magazines 11. A conveyor 15 for carrying the components from the magazines 11 to the insertion heads 13 comprises a rotary member having radially extending arms 17. The rotary conveyor has its axis of rotation at the center of the circular arrays of magazines 11 and insertion heads 13. The arms 17 extend a distance sufficient to pass beneath the magazines 11 as the conveyor rotates. A programming means for the apparatus comprises a cylindrical commutator member 21 fixedly mounted with its axis coincident with the axis of rotation of the conveyor 15. A carriage 23 is mounted directly on the conveyor 15 and carries wipers 25 which engage the commutator member.

For purposes of the present description, the number of component magazines will be assumed to be fifty, although it will be apparent that any number of component magazines may be employed. Similarly, the number of insertion heads will be assumed to be six, although in most applications a larger number of heads would be desirable.

Figures 2, 3, 4:
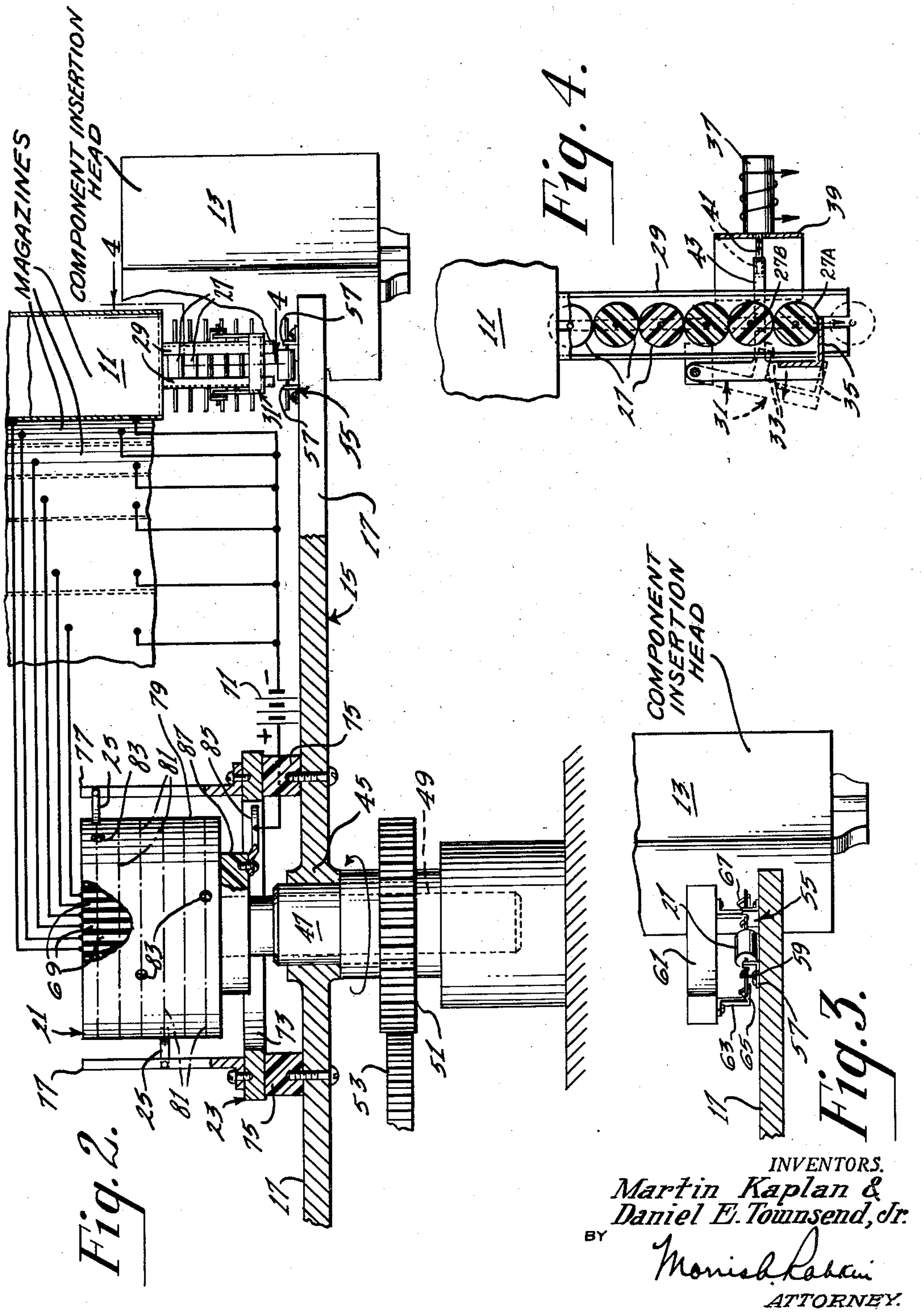
Figure 2 is a view in elevation, partially broken away, of the apparatus of Figure 1.
Figure 3 is a fragmentary view of the apparatus of Figure 1.
Figure 4 is a fragmentary view of a magazine discharge mechanism.

The magazines 11, as shown in Figures 2 and 4, are of a gravity feed type wherein components 27 are fed to a downwardly extending track 29. The components 27 are an axial lead type having a cylindrical body, for example, such as resistors or capacitors. The track 29 comprises two portions which enclose the ends of the component bodies and which have slots permitting the component leads to extend beyond the track.

A release mechanism for a magazine is shown particularly in Figure 4. This mechanism comprises an arm 31 which is pivotally mounted about a horizontal axis on the two portions of the track 29 and extends downwardly. The arm is biased, by means of a spring, for example, so that its normal position is the full line position shown in Figure 4. The arm 31 has a pair of fingers 33 which extend perpendicularly inwardly from the arm adjacent to the outer edges of the two track portions. The arm 31 is further provided with a projection 35 extending perpendicularly from the arm between the two track portions 29. The projection 35 is spaced downwardly from the fingers 33 a distance approximately equivalent to the diameter of a component body.

When the arm 31 is in its full line position, as shown in Figure 4, the body of the lowermost component 27A engages the projection 35. The remaining components within the track are supported by the component 27A. In order to effect the release of a single component, a solenoid 37 is mounted on a bracket 39 on the side of the track 29 opposite from the arm 31. A solenoid plunger 41 extends perpendicular to the track 29 and is provided with a pair of fingers 43 which extend parallel to the plunger and are aligned with the fingers 33 so that the two pairs of fingers 33 and 43 will engage each other in end to end relationship. In their normal position, the fingers 33 and 43 are spaced to permit the passage of the component leads between them. When the solenoid 37 is energized, the fingers 43 engage the fingers 33 and swing the arm 31 to the position shown by the dotted lines in Figure 4. In this position the component 27A is released from the track 29. The fingers 43 are now in position to intercept the leads of the second lowermost component 27B. The remaining components drop a small distance until the leads of the component 27B engage the fingers 43 of the solenoid plunger. When the solenoid is deenergized, the arm 31 moves back toward its full line position wherein the projection 35 prevents the release of any further components from the track. When the plunger 41 is fully withdrawn, the component 27B is no longer supported by the fingers 43 and the vertical stack of components drops to the projection 35.

The conveyor 15 comprises a hub 45 which is rigidly secured to a sleeve 47. The sleeve 47 is rotatably mounted on a fixed supporting shaft 49. A gear 51 is also rigidly secured to the sleeve 47 and meshes with a gear 53 representing a power source for driving the conveyor.

The conveyor 15 includes six radially extending arms 17 which correspond in number to the number of insertion heads 13. The arms 17 are shown to be equally spaced to correspond with the spacing of the insertion heads 13 in the circular array. Each of the arms 17 is associated with a particular insertion head and will deliver a particular component only to its associated head.

Each of the arms 17 is provided with a nest 55 which is adapted to receive a particular component from one of the magazines 11 and carry the component to its associated insertion head. Referring particularly to Figures 2 and 3, a nest 55 is shown for an axial lead component described above. This nest comprises a pair of arms 57 extending upwardly from the conveyor arm 17. The upper edges of these arms provide faces for supporting the leads of the component and each of the arms is provided with a notch 59 for receiving and retaining the component when it is released from the magazine.

The component insertion heads 13 may each be provided with a component pick-up mechanism as shown particularly in Figure 3. This mechanism comprises an extension 61 having a pair of fingers 63 which are adapted to be moved downwardly at the appropriate time to pick up a component from a conveyor nest 55 and to be immediately withdrawn upwardly. The fingers 63 are provided with laterally extending hooks 65 which include inclined cam surfaces 67 for raising the components upwardly as the component leads are engaged by the hooks. The cam surfaces 67 cause the components to be raised out of the nest 55 and the components are then retained within the hooks 65 which carry the components into the insertion heads 13 for further operation. Since the component insertion heads are not a part of the present invention, a further detailed description of their operation is not deemed necessary here.

The means for programming the release of the components 27 from the magazines 11 to the nests 55 includes the commutator member 21 which is fixedly mounted on the supporting shaft 49. The commutator 21 comprises a plurality of conductive segments 69 radially spaced about the outer curved surface of the commutator and insulated from each other. These segments are parallel to the axis of the commutator and extend the length of the commutator in an axial direction. The number of commutator segments 69 corresponds to the number of magazines 11 and each of the segments 69 is connected to one terminal of the release mechanism solenoid 37 of one of the magazines 11. The other terminals of the release mechanism solenoids are connected in common to a power supply, such as a battery 71. A portion of the operating circuit is shown schematically in Figure 2. The carriage 23, which carries the wipers 25, comprises a conductive ring 73 mounted on the conveyor 15 by means of insulating supporting blocks 75. The ring 73 is concentric with the commutator 21 and the conveyor. Six vertically extending, conductive arms 77 are mounted on the ring 73, each of the arms 77 being associated with one of the conveyor arms 17. The six arms 77 are shown in Figure 1 as being mounted directly above each of the six arms 17. This does not mean that the arms so physically associated are necessarily associated in function. Each of the arms 77 carries a wiper 25. The wipers of the six arms are all spaced from each other in an axial direction with respect to the commutator 21. This is necessary so that each of the wipers 25 will travel an individual track or path around the surface of the commutator.

In order to provide for the engagement of only one commutator segment 69 by each of the wipers 25, a mask 79 is fitted over the outer surface of the commutator. This mask is made of a thin, insulating material. Referring to Figure 2, the mask 79 is shown mounted on the commutator 21 and the paths of the six wipers 25 over the surface of the mask are indicated by broken lines 81. The mask 79 is provided with six apertures 83, a single aperture being provided in each of the wiper paths 81. Each of the apertures 83 exposes one of the commutator segments 69 to one of the wipers 25. By means of this mask, then, a particular magazine 11 is selected for each of the wipers 25 and hence for each of the conveyor arms 17. The positions of the apertures 83 in the mask are, of course, pre-selected and by this means the selection and order of components for a particular printed circuit are set up. It will be appreciated that a number of masks may be available for different printed circuit runs and that these masks are readily interchangeable.

In order to complete the electrical circuit between the wiper carriage 23 and the battery 71, a wiper 85 is supported on an insulating block 87 which is fixed to the supporting shaft 49. This wiper maintains constant contact with the inner surface of the carriage ring 73 and is connected to the battery 71. By this means a circuit is completed from each of the wipers 25 through the wiper arms 77, the conductive ring 73, and the wiper 85 to the battery.

In operation, the conveyor 15 is driven at a constant speed. A complete cycle of operation is performed with each single revolution of the conveyor 15. For purposes of description, a cycle starting point is assumed to be the point at which the conveyor arms 17 are positioned adjacent their associated insertion heads 13. As stated above, each of the arms 17 is associated with a particular insertion head 13 and will deliver a particular component 27 only to that particular head. As the conveyor now rotates through one revolution, each of the wipers 25 engages one of the commutator segments 69 through a mask aperture 83 thereby energizing the release mechanism of the magazine 11 associated with that particular commutator segment. The apparatus is so timed that when a component is released from a magazine by a particular wiper, the conveyor arm 17 associated with that wiper is positioned immediately beneath the magazine so that its nest 55 will receive the released component. As the conveyor rotates through one revolution, then, each of the conveyor nests 55 receives a component. The order in which the components are released to the conveyor is immaterial. As the conveyor reaches the starting point at the completion of one cycle, six components are delivered simultaneously to the six insertion heads in position for simultaneous pick off in the manner previously described.

Figure 5:
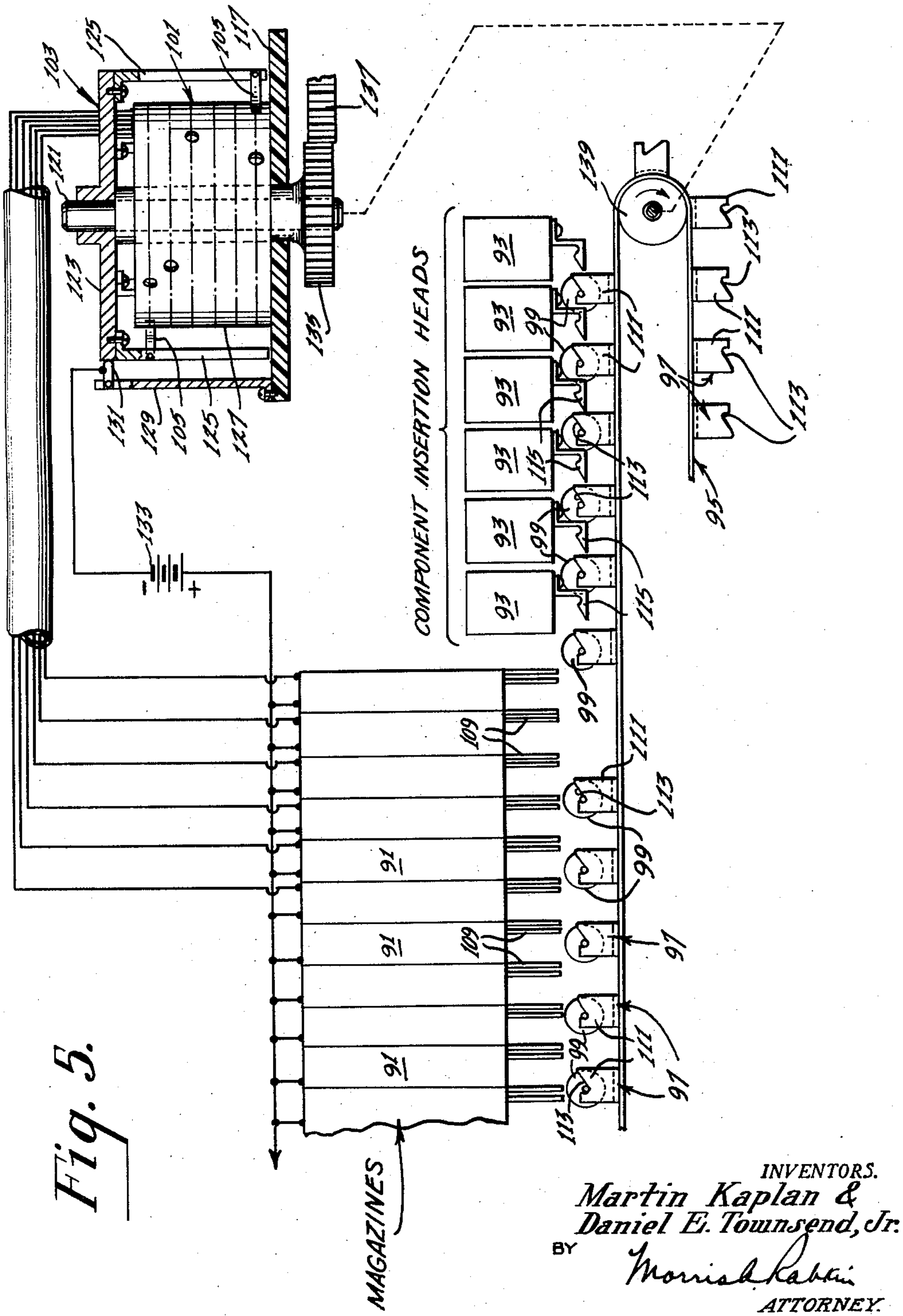
Figure 5 is a diagrammatic view in elevation of an alternative form of the invention.

Referring, now, in particular to Figure 5 of the accompanying drawings, a second embodiment of the invention will be described. In this embodiment, a plurality of magazines 91 are arranged in a straight-line array. A number of component insertion heads 93 are also arranged in a straight-line array. A conveyor or transfer mechanism 95 comprises a continuous belt which passes adjacent the magazines 91 and the component insertion heads 93. The conveyor 95 includes groups of nests 97 which receive components 99 from the magazines and carry them to the heads. The components 99 are similar to the components 27 previously described. A programming means for this embodiment comprises a cylindrical commutator 101 which is similar to the commutator 21 previously described. A carriage 103 is mounted for rotation about the commutator 101 and carries wipers 105 which engage the commutator segments. The rotation of the carriage 103 is synchronized with the conveyor 95.

For purposes of the present description, the number of component magazines again will be assumed to be fifty and the number of component insertion heads will be assumed to be six.

The magazines 91 are similar to the magazines 11 previously described and are provided with tracks 109 for releasing the components from the magazines. A mechanism for effecting the release of a single component from the magazines may be identical to that already described, and is not described or illustrated with reference to this embodiment of the invention.

The conveyor belt 95 is driven at a constant speed by means of a power source, not shown, and passes immediately beneath the component release mechanisms for the magazines and immediately adjacent the pick-up mechanisms for the component insertion heads. The conveyor 95 is provided with a plurality of groups of nests 97, each group including six nests. The nests in each group are spaced on the conveyor to correspond with the spacing of the component insertion heads 93 and each nest in a group is associated with a particular component insertion head. Each nest will deliver a particular component only to its associated head.

The nests 97 are similar in structure to the nests defined in the previous embodiment. Each nest comprises a pair of arms 111 extending from the surface of the conveyor belt 95. The arms 111 have supporting edges formed with a notch 113 for receiving and retaining the components 99 when they are released from the magazines.

The component insertion heads 93 may each be provided with a component pick-up mechanism 115 as previously described.

The means for programming the release of the components 99 from the magazines 91 is very similar to the programming means described previously. This means includes the commutator member 101 which is secured on a base 117 made of an insulating material. Each commutator segment is electrically connected to one of the magazine release mechanisms. The carriage 103 is supported on a shaft 121 which is rotatably supported in the base 117 and which extends through the center of the commutator 101. The carriage comprises a wheel 123, made of a conductive material, fixed to the upper end of the shaft 121. The rim of the wheel 123 is concentric with the shaft 121. Six downwardly extending, conductive arms 125 are mounted on the wheel 123 adjacent its outer periphery. Each of these arms 125 is functionally associated with a particular nest 97 in each of the conveyor nest groups. Each of the arms 125 carries a wiper 105. The wipers are spaced from each other in an axial direction with respect to the commutator 101 so that each of the wipers 105 will travel an individual track or path around the periphery of the commutator 101.

An arm 129 is mounted on the base 117 and extends upwardly adjacent the carriage 103. This arm 129 carries a wiper 131 which engages the outer periphery of the carriage wheel 123 to maintain a continuous electrical connection with the wheel 123. The wiper 131 is electrically connected to one terminal of a power supply, such as a battery 133. The release mechanisms of the component magazines 91 are connected in common to the other treminal of the battery 133. A portion of the operating circuit is shown diagrammatically in the drawing.

A gear 135 is rigidly fixed to the lower end of the shaft 121. The gear 135 meshes with a gear 137 which represents the driving source for the apparatus. The shaft 121 is coupled (by means not shown) to a pulley 139 which is the drive pulley for the conveyor belt 95. The synchronism between the carriage 103 and the conveyor belt 95 is accomplished by this coupling.

In order to provide for the engagement of only one commutator segment by each of the wipers 105, a mask 127, similar to the mask 79, previously described, is fitted over the commutator 101. The program means then operates in a manner already described to select components from individual magazines 91 to be released to the conveyor nests 97.

In operation, the conveyor 95 is driven at constant speed. A complete cycle of operation is performed when a group of conveyor nests 97 completes one circuit around the conveyor belt 95 from a position adjacent the component insertion heads 93, for example. In its circuit around the belt, each of the nests 97 in the group receives a particular component from one of the magazines and delivers the component to its associated head. The six nests of the group deliver six components simultaneously to the six heads, although the components will be received by the six nests in random order as set up by the programming means.

As previously stated, one complete circuit of the conveyor belt 95 is necessary for one complete cycle. However, during one circuit of the belt, several cycles may be completed since one cycle of operation may be completed by more than one group of nests 97. As illustrated in the drawing, the nests 97 are arranged in groups of six corresponding to the number of component insertion heads 93 and any number of nest groups may be provided on the conveyor belt 95.

In order to synchronize the operation of the system, it is necessary that one revolution of the program mechanism carriage 103 occur in the same time interval required for one nest group to traverse the array of component magazines. In other words, the time required for a wiper 105 to travel around the periphery of the commutator 101 will be equivalent to the time required for a specified length of the conveyor 95 to pass a fixed point.

What is claimed is:

1. In an article distributing system, the combination of a plurality of article storage bins, a plurality of article receiving stations each of which is adapted to receive a specific article, a conveyor comprising a plurality of article carrying members, each of said article carrying members being associated with one of said article receiving stations to carry a specific article from one of said storage bins to its associated receiving station, release means associated with each bin for releasing articles singly therefrom to an article carrying member, and means for programming the operation of said bin release means, said programming means being timed with said conveyor mechanism to program the release of specific articles from said storage bins to said article carrying members.

2. In a system for distributing a plurality of articles from fixed magazines to a plurality of article receiving stations each of which is adapted to receive a specific article from one of said magazines, means for discharging articles individually from said magazines, a conveyor operable to transfer articles from said magazines to said receiving stations, said conveyor including a plurality of article transfer members each associated with one of said receiving stations and adapted to transfer a specific article, said transfer members being adapted to receive articles discharged from said magazines, and means for programming the discharge of articles from said magazines to said transfer members, said programming means including a commutator having conductive segments about its periphery each associated with a magazine discharging means, and means operating in synchronism with said conveyor mechanism for selectively engaging said commutator segments to effect the discharge of specific articles to said article transfer members.

3. In a system for distributing a plurality of articles from storage bins to a plurality of article receiving stations, said receiving stations being arranged serially in a predetermined order and each being adapted to handle a specific one of said articles, means for discharging said articles individually from said bins, a conveyor mechanism operable to transfer articles from said bins to said receiving stations, said mechanism including a plurality of transfer members each associated with one of said receiving stations to deliver a specific article to its associated receiving station, said transfer members being arranged serially to correspond to the arrangement of the associated receiving stations whereby articles are delivered to each of said receiving stations simultaneously, said transfer members being adapted to receive articles discharged from said bins, means for programming the discharge of articles from said bins to said transfer members, said programming means including a commutator having conductive segments about its periphery each associated with a bin discharging means, means for engaging said commutator segments including an individual wiper associated with each of said transfer members, and means for exposing only one of said commutator segments to each of said wipers, said last named means programming the discharge of specific articles to said transfer members.

4. In a system for distributing articles to a plurality of article receiving stations, a series of bins for storing different kinds of articles, means for discharging said articles individually from each of said bins, a conveyor mechanism, said mechanism including a plurality of transfer members each associated with one of said article receiving stations, said transfer members each being adapted to receive a particular article discharged from one of said bins, means for programming the discharge of articles from said bins to said transfer members, said programming means comprising a commutator having radially separated conductive segments each connected to the discharge means of a particular bin, a carriage rotatably mounted with respect to said commutator and having a plurality of wipers, said wipers being spaced axially with respect to the surface of said commutator and each being associated with one of said transfer members, means for masking said drum whereby each of said wipers engages only one of said commutator segments during each revolution of said carriage, and said programming means causing the discharge of an article from a particular bin to a particular transfer member when a particular transfer member is positioned to receive said article.

5. A system for the programmed selection and transfer of articles comprising a plurality of bins for storing different kinds of articles, a plurality of article receiving stations each adapted to receive a particular kind of article stored, a conveyor mechanism including a plurality of transfer members each identified with one of said article receiving stations, said transfer members being disposed to deliver articles simultaneously to each of said article receiving stations, a discharge mechanism associated with each of said bins for discharging articles therefrom one at a time, a fixed commutator having radially separated conductive segments each connected to the discharge mechanism of a bin, a carriage rotatably mounted with respect to said commutator carrying wiper contacts each identified with one of said transfer members, a mask for said commutator having apertures for exposing one of said commutator segments to each of said wiper contacts, and said conveyor mechanism and said carriage being driven in synchronism whereby particular articles are discharged from said bins onto each of said transfer members, said transfer members presenting the particular articles simultaneously to their associated article receiving stations.

6. In a system for distributing articles to fixed article receiving stations arranged in a circular array, a plurality of article storage bins arranged in a circular array concentric with said array of article receiving stations, a discharge mechanism for each bin for discharging articles individually therefrom, a conveyor mechanism rotatably mounted in the center of said circular arrays and having radially extending transfer arms, said transfer arms being adapted to receive particular articles from said bins and to carry them to said article receiving stations, a fixed commutator mounted concentrically of said circular arrays, said commutator having segments each connected to the discharge mechanism of one bin, and means mounted on said conveyor for selectively engaging said segments to program the release of particular articles from said bins to said transfer arms.

7. In a system for distributing articles to fixed article receiving stations arranged in a circular array, a plurality of article storage bins arranged in a circular array concentric with said array of article receiving stations, a discharge mechanism for each bin for discharging articles individually therefrom, a conveyor mechanism rotatably mounted in the center of said circular arrays and having radially extending transfer arms, said transfer arms being adapted to receive particular articles from said bins and to carry them to associated article receiving stations each adapted to receive a particular article, means for programming the discharge of articles from said bins, said programming means comprising a fixed commutator having conductive segments and being mounted concentrically of said circular arrays, each of said segments being connected to the discharge mechanism of one bin, a wiper assembly comprising a plurality of wipers for engagement with said commutator segments, said wiper assembly being mounted on said conveyor, each wiper being associated with one of said transfer arms, and a mask for said commutator having holes disposed to expose one of said commutator segments to each of said wiper arms.

8. In an article distribution system, a plurality of bins for storing different articles, each bin having an article release mechanism, a plurality of article receiving stations each adapted to receive a particular one of said articles, conveyor means for delivering articles simultaneously to said article receiving stations, said conveyor means comprising article transfer members each associated with a particular one of said article receiving stations, means for programming the release of articles from said bins to said conveyor transfer members comprising a commutator having spaced conductive segments and a wiper carriage rotatably mounted with respect to said commutator, means connecting each of said commutator segments to the release mechanism of a corresponding bin, said wiper carriage including a wiper associated with each of said article transfer members, means connecting said wiper carriage to said bin release mechanisms through a power supply, means effecting the engagement of only one of said segments by each wiper whereby each article transfer member receives an article from only one bin, and means coupling said conveyor and said wiper carriage in timed relationship.

9. In a system for distributing articles to a group of receiving stations adapted to receive different kinds of articles, a plurality of bins for storing different kinds of articles, a mechanism associated with each of said bins for releasing individual articles therefrom, a conveyor for carrying articles from said bins to said receiving stations, said conveyor comprising at least one group of article carrying members, the article carrying members in one group being disposed on said conveyor to deliver articles simultaneously to each of said group of receiving stations, each of the article carrying members in a group being associated with one of said group of receiving stations to deliver one kind of article to its associated receiving station, means for actuating each of said bin release mechanisms, and means for programming the actuation of said bin release mechanisms whereby each article carrying member receives an article from a particular one of said bins.

10. In a system for distributing articles to a group of receiving stations adapted to receive different kinds of articles, a plurality of bins for storing different kinds of articles, a mechanism associated with each of said bins for releasing individual articles therefrom, a conveyor for carrying articles from said bins to said receiving stations, said conveyor comprising a group of article carrying members disposed on said conveyor to deliver articles simultaneously to each of said group of receiving stations, each of the article carrying members being associated with one of the receiving stations to deliver one kind of article to its associated receiving station, means for actuating each of said bin release mechanisms, and means for programming the actuation of said bin release mechanisms whereby each article carrying member receives an article from a particular one of said bins.

11. In a system for distributing articles to a group of receiving stations adapted to receive different kinds of articles, a plurality of bins for storing different kinds of articles, a mechanism associated with each of said bins for releasing individual articles therefrom, a conveyor for carrying articles from said bins to said receiving stations, said conveyor comprising a plurality of groups of article carrying members, the article carrying members in each group being disposed on said conveyor to deliver articles simultaneously to each of said group of receiving stations, each of the article carrying members in a group being associated with one of said group of receiving stations to deliver one kind of article to its associated receiving station, means for actuating each of said bin release mechanisms, and means for programming the actuation of said bin release mechanisms whereby each article carrying member receives an article from a particular one of said bins.

References Cited in the file of this patent

UNITED STATES PATENTS 2,374,537 Goldsmith ------------ Apr. 24, 1945